(12) United States Patent
Guan et al.

(10) Patent No.: US 12,740,029 B2
(45) Date of Patent: Sep. 15, 2026

(54) POWER DEVICE AND ENERGY STORAGE CONVERTER

(71) Applicant: JINGTSING TECHNOLOGY LTD, Beijing (CN)

(72) Inventors: Eryong Guan, Beijing (CN); Dongyang Wang, Beijing (CN)

(73) Assignee: JINGTSING TECHNOLOGY LTD, Beijing (CN)

( * ) Notice: Subject to any disclaimer, the term of this patent is extended or adjusted under 35 U.S.C. 154(b) by 312 days.

(21) Appl. No.: 18/697,620

(22) PCT Filed: Dec. 29, 2022

(86) PCT No.: PCT/CN2022/143229
§ 371 (c)(1),
(2) Date: Apr. 1, 2024

(87) PCT Pub. No.: WO2024/138501
PCT Pub. Date: Jul. 4, 2024

(65) Prior Publication Data
US 2026/0156791 A1 Jun. 4, 2026

(51) Int. Cl.
*H05K 7/20* (2006.01)

(52) U.S. Cl.
CPC ................................ *H05K 7/20927* (2013.01)

(58) Field of Classification Search
CPC .. H05K 7/20927; H05K 7/20; H05K 7/20272; H05K 7/20945; H05K 7/14322;
(Continued)

(56) References Cited

U.S. PATENT DOCUMENTS 5,365,424 A * 11/1994 Deam .................. H10W 72/00 257/E23.141
5,517,063 A * 5/1996 Schantz, Jr. ............. B60L 3/00 363/71
(Continued)

FOREIGN PATENT DOCUMENTS

CN 201893688 U 7/2011
CN 106329952 A 1/2017
(Continued)

OTHER PUBLICATIONS

Kawashima Tetsuya, WO-2013136877-A1, Power Converter Device Installed in E.g. Electric Vehicle, Has Semiconductor Power Module That Is Arranged in Cooling Channel, When Channel Housing, Direct Current (DC) and Alternating Current (AC) Bus-bars Are Connected Thermally, PE2E search translation (Year: 2013).*
(Continued)

*Primary Examiner* — Michael A Matey
(74) *Attorney, Agent, or Firm* — Scully, Scott, Murphy & Presser, P.C.

(57) ABSTRACT

A power device and an energy storage converter are provided. The power device includes a liquid cooling plate, a power semiconductor device, a first copper bar, and a laminated busbar. The liquid cooling plate includes a first side, a second side, a third side, and a fourth side. The power semiconductor device is arranged at the third side of the liquid cooling plate. The driving board is arranged at the third side of the liquid cooling plate and connected to the power semiconductor device. One end of the first copper bar is connected to the power semiconductor device, and an AC side interface is formed in the other end of the first copper bar and is arranged at the first side of the liquid cooling plate.

20 Claims, 7 Drawing Sheets

(58) Field of Classification Search
CPC ........... H05K 7/14329; H05K 7/20218; H05K 7/20263; H05K 7/20872; H05K 7/20445; H05K 7/2089; H05K 7/209; H02M 7/003; H02M 1/0048; H02M 7/00; H02M 7/537; H02M 7/797; H02K 11/33; H02K 5/203; H02K 2211/03; H02K 5/1732; H02K 5/20; B60K 11/02; B60L 2210/40; B60L 2240/525; F04B 39/064; F04B 39/121
See application file for complete search history.

(56) References Cited

U.S. PATENT DOCUMENTS

| | | | | |
|---|---|---|---|---|
| 5,729,450 | A * | 3/1998 | Dimino | H02M 7/003 363/39 |
| 6,982,873 | B2 * | 1/2006 | Meyer | H02M 7/003 174/15.1 |
| 8,193,449 | B2 * | 6/2012 | Esmaili | H05K 7/14329 174/70 B |
| 9,666,968 | B2 * | 5/2017 | Menzies | H05K 7/14329 |
| 2009/0231811 | A1 * | 9/2009 | Tokuyama | H05K 7/20927 361/699 |
| 2010/0108836 | A1 * | 5/2010 | Miller | B60L 53/20 248/220.21 |
| 2011/0228508 | A1 * | 9/2011 | Inuduka | H01G 4/228 361/811 |
| 2014/0119087 | A1 * | 5/2014 | Matsuoka | H02M 7/003 363/132 |
| 2015/0138689 | A1 * | 5/2015 | Sharaf | H01G 4/228 361/301.2 |
| 2017/0063066 | A1 * | 3/2017 | Doo | H02G 5/005 |
| 2019/0296658 | A1 * | 9/2019 | Chung | B60L 50/51 |

FOREIGN PATENT DOCUMENTS

| | | | |
|---|---|---|---|
| CN | 108233725 | A | 6/2018 |
| CN | 211606402 | U | 9/2020 |
| CN | 112311249 | A | 2/2021 |
| JP | 2019021664 | A | 2/2019 |

OTHER PUBLICATIONS

He, Dan-mei, CN-210898956-U, Integrated Power Unit, Has Rectifier Unit Whose Output End Is Electrically Connected Input End of Electrolytic Capacitor Unit, and Inverter Connected With First IGBT, Second IGBT and Third IGBT, Where Third IGBT Is Electrically Connected With Chopper Unit, PE2E Translation (Year: 2020).*

Mo, Tao-bo, CN-208112497-U, Modular Wind Power Current Transformer Power Unit, Has Alternating Current Leading-out Copper Bar Connected With Alternating Current Connecting Copper Bar, and Insulating Supporting Plate Equipped With Water-cooling Plate Supporting Plate, PE2E Translation (Year: 2018).*

Liu, Xiao-peng, CN-111555593-A, Power Conversion Unit and Mining Frequency Converter, PE2E Translation (Year: 2020).*

Lei Yang et al., CN201893688, Megawatt Power Conversion Component, Espacenet (Year: 2011).*

International Search Report dated Sep. 4, 2023 received in International Patent Application No. PCT/CN2022/143229.

Extended Supplementary European Search Report dated Jul. 30, 2025 received in European Application No. 22964630.2.

* cited by examiner

POWER DEVICE AND ENERGY STORAGE CONVERTER

CROSS-REFERENCE TO RELATED APPLICATION

This application is a National Stage Entry under 35 U.S.C. § 371 of PCT International Application No. PCT/CN2022/143229, filed on Dec. 29, 2022, the entire contents of which are herein incorporated by reference.

FIELD

The present disclosure relates to the technical field of energy storage converters, and particularly relates to a power device and an energy storage converter.

BACKGROUND

Currently, the power density of a mainstream rack mounted energy storage converter in the market is not very high, and its power device also usually adopts a large-sized design. With the large-scale application of integrated energy storage systems, the space provided for energy storage converters is getting smaller and smaller, and the requirement on unit energy density is higher. For an energy storage converter, the power device occupies a relatively large size, it is possible to further compress the space, and it is urgent to develop a power device with a compact structure and a high power density.

SUMMARY

In order to solve or improve the technical problems that the traditional power device is not compact in structure and the power density thereof is not high, a purpose of the present disclosure lies in providing a power device.

Another purpose of the present disclosure lies in providing an energy storage converter having the above power device.

In order to achieve the above purposes, the first aspect of the present disclosure provides a power device, comprising: a liquid cooling plate, wherein the liquid cooling plate is provided with a first side and a second side arranged opposite to each other along a first direction, the liquid cooling plate is provided with a third side and a fourth side arranged opposite to each other along a second direction, the second direction is perpendicular to the first direction, the liquid cooling plate comprises a liquid cooling interface, and the liquid cooling interface is provided at the first side of the liquid cooling plate; a power semiconductor device, arranged at the third side of the liquid cooling plate and connected to the liquid cooling plate, wherein the power semiconductor device has a heat dissipation substrate at one side close to the liquid cooling plate, and the heat dissipation substrate is connected to the liquid cooling plate; a driving board, arranged at the third side of the liquid cooling plate and connected to one side of the power semiconductor device away from the heat dissipation substrate; a first copper bar, wherein one end of the first copper bar is connected to the power semiconductor device, and an AC side interface is formed at the other end of the first copper bar and is arranged at the first side of the liquid cooling plate; a laminated busbar, comprising: a first section, arranged at the third side of the liquid cooling plate, wherein one end of the first section is connected to the power semiconductor device; a second section, arranged at the second side of the liquid cooling plate, wherein, one end of the second section is connected to the other end of the first section; a third section, arranged at the fourth side of the liquid cooling plate, wherein, one end of the third section is connected to the other end of the second section, the other end of the third section is provided with a DC side interface, and the DC side interface is arranged at the first side of the liquid cooling plate; and a capacitor bank, arranged on the fourth side of the liquid cooling plate, wherein the capacitor bank is connected to the third section of the laminated busbar.

According to the technical solution of the power device provided by the present disclosure, through disposing the power semiconductor device at the third side of the liquid cooling plate, disposing the capacitor bank at the fourth side of the liquid cooling plate, disposing the AC side interface and the DC side interface at the first side of the liquid cooling plate, winding the laminated busbar on the third side of the liquid cooling plate, the second side of the liquid cooling plate and the fourth side of the liquid cooling plate, firstly, the spatial layout of the power device can be optimized, the structures and components become more compact therebetween, which is beneficial for reducing the overall volume of the power device and improving the power density per unit volume; secondly, the heat exchanging ability of the liquid cooling plate can be fully used, it is ensured that each structure or each component in the power device works at a suitable temperature, and this helps prolong the service life.

Specifically, the power device comprises the liquid cooling plate, the power semiconductor device, the driving board, the first copper bar, the laminated busbar and the capacitor bank. Wherein, the liquid cooling plate comprises the first side and the second side arranged opposite to each other along the first direction. The liquid cooling plate comprises the third side and the fourth side arranged opposite to each other along the second direction. The second direction is perpendicular to the first direction. Optionally, the first direction of the liquid cooling plate is a length direction or a width direction of the liquid cooling plate. Optionally, the second direction of the liquid cooling plate is a thickness direction of the liquid cooling plate. The liquid cooling plate comprises the liquid cooling interface. The liquid cooling interface is provided at the first side of the liquid cooling plate. Optionally, there are two liquid cooling interfaces, wherein, one liquid cooling interface is an inlet side interface, and the other liquid cooling interface is an outlet side interface. Through disposing the liquid cooling interface, a cooling liquid can be driven by an external cooling system to enter the liquid cooling plate from the inlet side interface and absorb the heat on the liquid cooling plate conducted from the power semiconductor device or other components, and then flow out of the outlet side interface. The liquid cooling plate is mainly used for cooling the power semiconductor device and cooling other components around the power semiconductor device.

Furthermore, the power semiconductor device is provided at the third side of the liquid cooling plate. Optionally, the power semiconductor device is arranged at the side of the liquid cooling plate in the thickness direction. The power semiconductor device is provided with a heat dissipation substrate at the side close to the liquid cooling plate. The heat dissipation substrate is connected to the liquid cooling plate. The heat dissipated from the power semiconductor device is subjected to heat exchange with the liquid cooling plate through the heat dissipation substrate on the bottom.

Optionally, the heat dissipation substrate of the power semiconductor device adopts a heat conductive material to contact the liquid cooling plate.

Furthermore, the driving board is provided at the third side of the liquid cooling plate. The driving board is connected to the side of the power semiconductor device away from the heat dissipation substrate. Optionally, the driving board is connected to a pin at the top of the power semiconductor device.

Furthermore, one end of the first copper bar is connected to the power semiconductor device. The other end of the first copper bar is formed with the AC side interface. The AC side interface is provided at the first side of the liquid cooling plate.

Furthermore, the laminated busbar comprises the first section, the second section and the third section. Specifically, the first section is provided at the third side of the liquid cooling plate. One end of the first section is connected to the power semiconductor device. The second section is provided at the second side of the liquid cooling plate. One end of the second section is connected to the other end of the first section, i.e., one end of the second section is connected to the end of the first section away from the power semiconductor device. The third section is provided at the fourth side of the liquid cooling plate. One end of the third section is connected to the other end of the second section, i.e., one end of the third section is connected to the end of the second section away from the first section. The other end (the end of the third section away from the second section) of the third section is formed with the DC side interface. The DC side interface is provided at the first side of the liquid cooling plate. The laminated busbar winds the third side of the liquid cooling plate, the second side of the liquid cooling plate and the fourth side of the liquid cooling plate, the heat produced by the laminated busbar can be subjected to heat exchange with the liquid cooling plate via the natural convection of air, so as to ensure the working performance of the laminated busbar. The laminated busbar is also called a compound busbar, a stacked busbar, a stacked busbar row or a composite copper bar, and is a connection row of a multi-layer composite structure.

Furthermore, the capacitor bank is provided at the fourth side of the liquid cooling plate. The capacitor bank is connected to the third section. The heat produced by the capacitor bank can be subjected to heat exchange with the liquid cooling plate via the natural convection of air, so as to ensure the working performance of the capacitor bank. Through disposing the capacitor bank, a DC voltage can be stabilized, and the voltage fluctuation at a DC side is reduced. In addition, since both the AC side interface and the DC side interface are provided at the first side of the liquid cooling plate, the liquid cooling plate can also be used to cool the AC side interface and the DC side interface. Generally, all types of interfaces need to reserve a sufficient space for assembling operations, and thus, in order to reduce the operation space of a cabinet, the AC side interface and the DC side interface of the power device and the liquid cooling interface of the liquid cooling plate are all provided at the first side of the liquid cooling plate, and this designing method can maximize the use of the space of the cabinet.

In the technical solution defined in the present disclosure, through disposing the power semiconductor device at the third side of the liquid cooling plate, disposing the capacitor bank at the fourth side of the liquid cooling plate, disposing the AC side interface and the DC side interface at the first side of the liquid cooling plate, winding the laminated busbar on the third side of the liquid cooling plate, the second side of the liquid cooling plate and the fourth side of the liquid cooling plate, firstly, the spatial layout of the power device can be optimized, the structures and components become more compact therebetween, which is beneficial for reducing the overall volume of the power device and improving the power density per unit volume; secondly, the heat exchanging ability of the liquid cooling plate can be fully used, it is ensured that each structure or each component in the power device works at a suitable temperature, and this helps prolong the service life.

In addition, the above technical solution provided by the present disclosed can further comprise the following additional technical features:

in some technical solutions, optionally, the power device further comprises: a heat conductive layer, provided between the heat dissipation substrate of the power semiconductor device and the liquid cooling plate.

In the technical solution, the power device further comprises the heat conductive layer. Specifically, the heat conductive layer is provided between the heat dissipation substrate of the power semiconductor device and the liquid cooling plate. Disposing the heat conductive layer can fill tiny gaps between the heat dissipation substrate of the power semiconductor device and the liquid cooling plate, and further improve the heat exchanging efficiency. Optionally, the heat conductive layer adopts the materials such as silicone grease, and is used to fill the gaps between the heat dissipation substrate and the liquid cooling plate.

In some technical solutions, optionally, the power device further comprises: an electric current sensor, wherein the first copper bar penetrates the electric current sensor.

In the technical solution, the power device further comprises the electric current sensor. Specifically, the first copper bar penetrates the electric current sensor. The electric current sensor is used for obtaining the value of the electric current of the AC side interface.

In some technical solutions, optionally, the power device further comprises: an absorption capacitor, connected to the first section, wherein the absorption capacitor is connected to the power semiconductor device.

In the technical solution, the power device further comprises the absorption capacitor. Specifically, the absorption capacitor is connected to the first section of the laminated busbar. The absorption capacitor is connected to the power semiconductor device. The absorption capacitor has the function similar to a low pass filter in circuits, and can absorb a peak voltage.

In some technical solutions, optionally, the absorption capacitor is provided at the third side of the liquid cooling plate, the longest distance between the laminated busbar and the liquid cooling plate in the second direction is a first distance, the longest distance between the absorption capacitor and the liquid cooling plate in the second direction is a second distance, and the first distance is not greater than the second distance.

In the technical solution, through disposing the absorption capacitor at the third side of the liquid cooling plate, the heat produced by the absorption capacitor can be subjected to heat exchange with the liquid cooling plate via the natural convection of air, so as to ensure the working performance of the absorption capacitor. Optionally, the absorption capacitor is provided at a position of the third side of the liquid cooling plate close to the second side. In addition, the longest distance between the laminated busbar and the liquid cooling plate in the second direction is not greater than the longest distance between the absorption capacitor and the liquid cooling plate in the second direction, so as to ensure that the rear side (the side in the second direction) of the power device can keep the smallest distance with the cabinet, and the structures and components become more compact therebetween, which is beneficial for reducing the overall volume of the power device and improving the power density per unit volume.

In some technical solutions, optionally, the power semiconductor device is connected to the liquid cooling plate via a first connecting member.

In the technical solution, through disposing the first connecting member, a detachable connection between the heat dissipation substrate of the power semiconductor device and the liquid cooling plate can be achieved, and this helps an operator to disassemble and assemble the power semiconductor device. Optionally, the first connecting member is a screw.

In some technical solutions, optionally, the number of the power semiconductor device is at least one.

In the technical solution, through disposing at least one power semiconductor device, i.e., there can be one, two or multiple power semiconductor devices; considering the size of the occupied space, the cost and other factors, the power semiconductor device can be disposed flexibly according to actual needs. Optionally, when there are two or multiple power semiconductor devices, the power semiconductor devices are in parallel connection.

In some technical solutions, optionally, the included angle between the second section and the first section is 85° to 95°.

In the technical solution, through disposing the included angle between the second section and the first section to be 85° to 95°, the bending and commutating of the laminated busbar can be achieved, and this helps reduce the size of the space occupied by the laminated busbar, and is convenient for the connection of different members. Optionally, the included angle between the first section and the second section is 90°, i.e., the first section is perpendicular to the second section.

In some technical solutions, optionally, the included angle between the third section and the second section is 85° to 95°.

In the technical solution, through disposing the included angle between the third section and the second section to be 85° to 95°, the bending and commutating of the laminated busbar can be achieved, and this helps reduce the size of the space occupied by the laminated busbar, and is convenient for the connection of different members. Optionally, the included angle between the second section and the third section is 90°, i.e., the second section is perpendicular to the third section.

The second aspect of the present disclosure provides an energy storage converter, comprising: a cabinet; the power device in any of the above technical solutions, provided in the cabinet, wherein the power device is connected to the cabinet.

According to the technical solution of the energy storage converter of the present disclosure, the energy storage converter comprises the cabinet and the power device in any of the above technical solutions. The power device is disposed in the cabinet. The power device is connected to the cabinet. Compared with a traditional structure, the energy storage converter defined in the present disclosure has a more compact structure and a smaller volume, and has a higher power density per unit volume.

Wherein, since the energy storage converter comprises any power device in the above first aspect, it has the beneficial effect of any of the above technical solutions, which are not repeated herein.

The additional aspects and advantages of the present disclosure will be obvious in the following description, or can be understood through the practice of the present disclosure.

Figure 1:
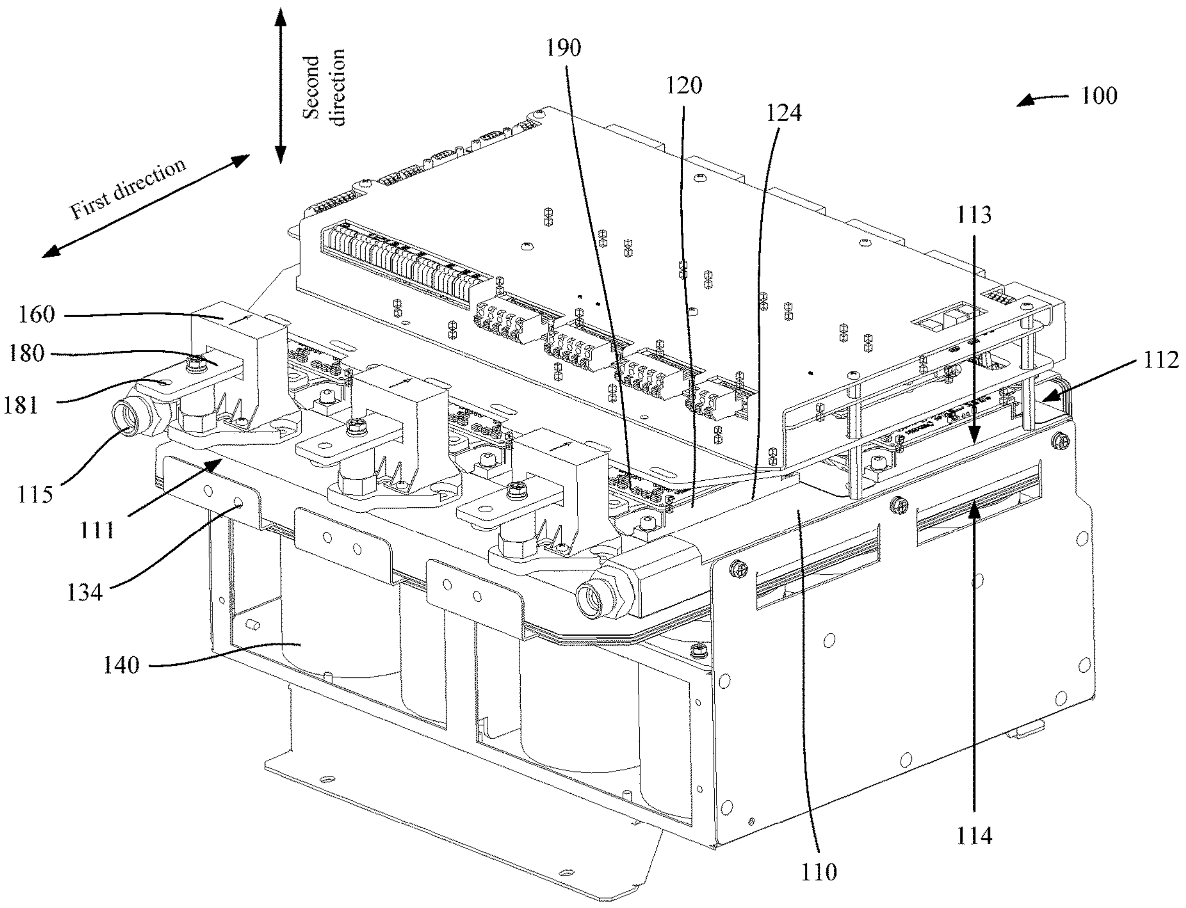
FIG. 1 is a first schematic view of a power device according to an embodiment of the present disclosure.
Figure 2:
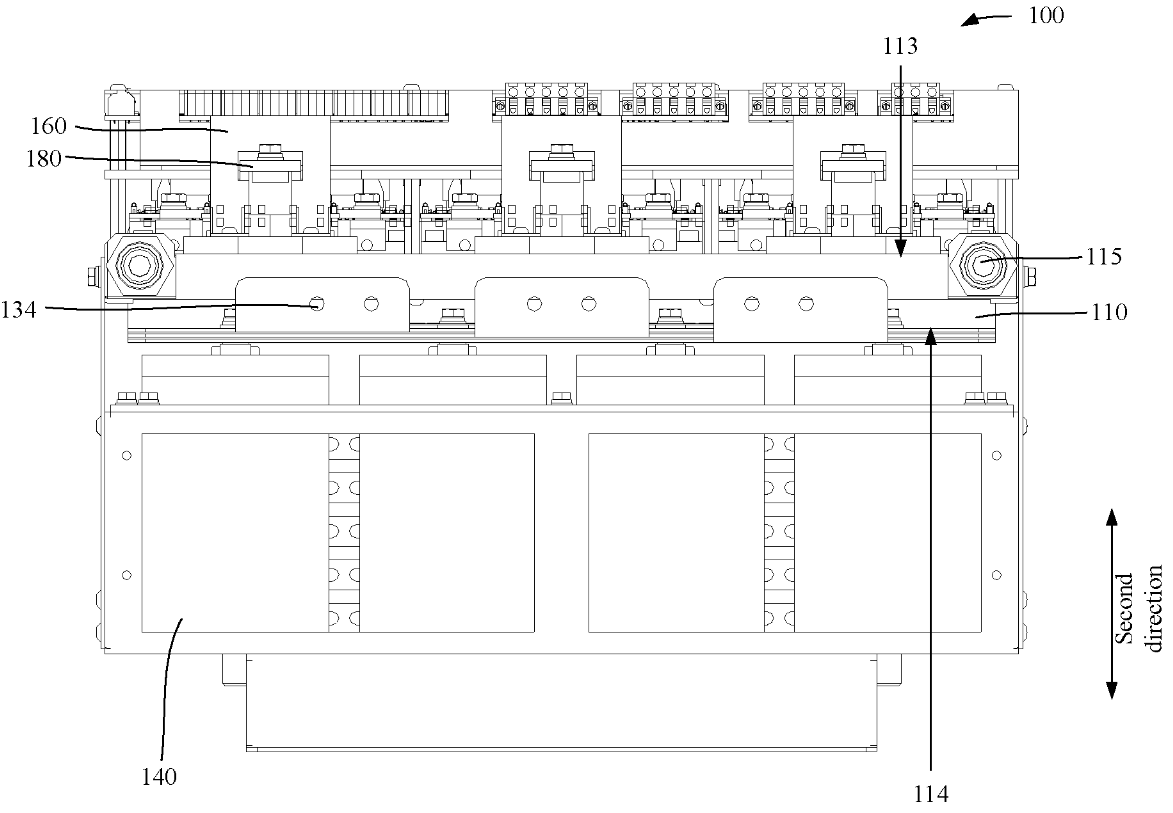
FIG. 2 is a second schematic view of a power device according to an embodiment of the present disclosure.

Wherein, the corresponding relations between the reference signs and the component names in FIG. 1 to FIG. 7 are as follows:

100: power device, 110: liquid cooling plate, 111: first side, 112: second side, 113: third side, 114: fourth side, 115: liquid cooling interface, 120: power semiconductor device, 124: heat dissipation substrate, 130: laminated busbar, 131: first section, 132: second section, 133: third section, 134: DC side interface, 140: capacitor bank, 150: absorption capacitor, 160: electric current sensor; 171: first connecting member, 180: first copper bar, 181: AC side interface, 190: driving board, 200: energy storage converter, and 210: cabinet.

DETAILED DESCRIPTION OF THE DISCLOSURE

To more clearly understand the above purposes, features and advantages of the present disclosure, the present disclosure will be further detailed hereinafter in combination with the accompanying drawings and embodiments. It should be indicated that in the case of no conflict, the embodiments and the features in the embodiments of the present disclosure can be combined with each other.

Many details are illustrated in the following description for the convenience of a thorough understanding to the present disclosure, but the present disclosure can also be implemented using other embodiments other than these described herein. Therefore, the protection scope of the present disclosure is not limited to the specific embodiments disclosed in the following text.

A power device 100 and an energy storage converter 200 according to some embodiments of the present disclosure are described in the following by referring to FIG. 1 to FIG. 7.

According to an embodiment of the present disclosure, as shown in FIG. 1, FIG. 2, FIG. 3 and FIG. 4, the power device 100 comprises a liquid cooling plate 110, a power semiconductor device 120, a driving board 190, the first copper bar 180, the laminated busbar 130 and the capacitor bank 140. Wherein, the liquid cooling plate 110 comprises the first side 111 and the second side 112 arranged opposite to each other along the first direction. The liquid cooling plate 110 comprises the third side 113 and the fourth side 114 arranged opposite to each other along the second direction. The second direction is perpendicular to the first direction.

Optionally, the first direction of the liquid cooling plate 110 is a length direction or a width direction of the liquid cooling plate 110. Optionally, the second direction of the liquid cooling plate 110 is a thickness direction of the liquid cooling plate 110. The liquid cooling plate 110 comprises the liquid cooling interface 115. The liquid cooling interface 115 is provided at the first side 111 of the liquid cooling plate 110. Optionally, there are two liquid cooling interfaces 115, wherein, one liquid cooling interface 115 is an inlet side interface, and the other liquid cooling interface 115 is an outlet side interface. Through disposing the liquid cooling interface 115, a cooling liquid can be driven by an external cooling system to enter the liquid cooling plate 110 from the inlet side interface and absorb the heat on the liquid cooling plate 110 conducted from the power semiconductor device 120 or other components, and then flow out of the outlet side interface. The liquid cooling plate 110 is mainly used for cooling the power semiconductor device and cooling other components around the power semiconductor device.

Figure 3:
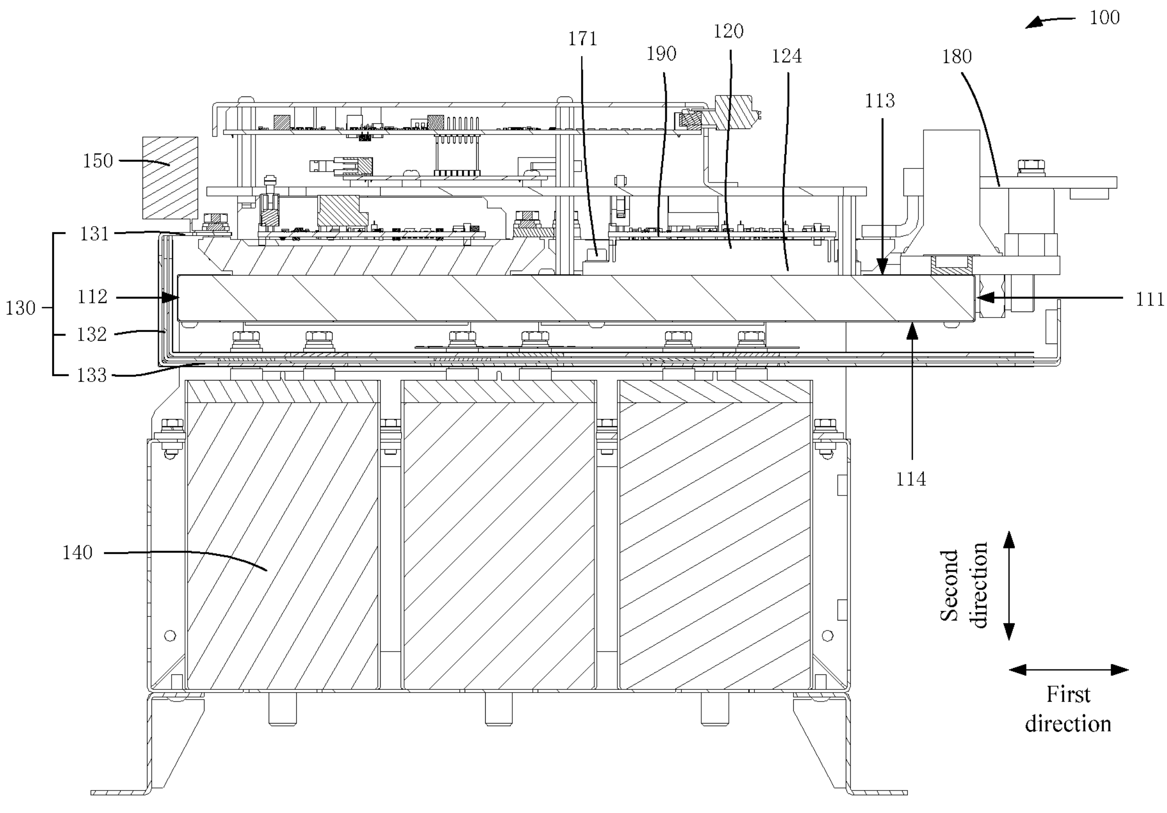
FIG. 3 is a third schematic view of a power device according to an embodiment of the present disclosure.
Figure 4:
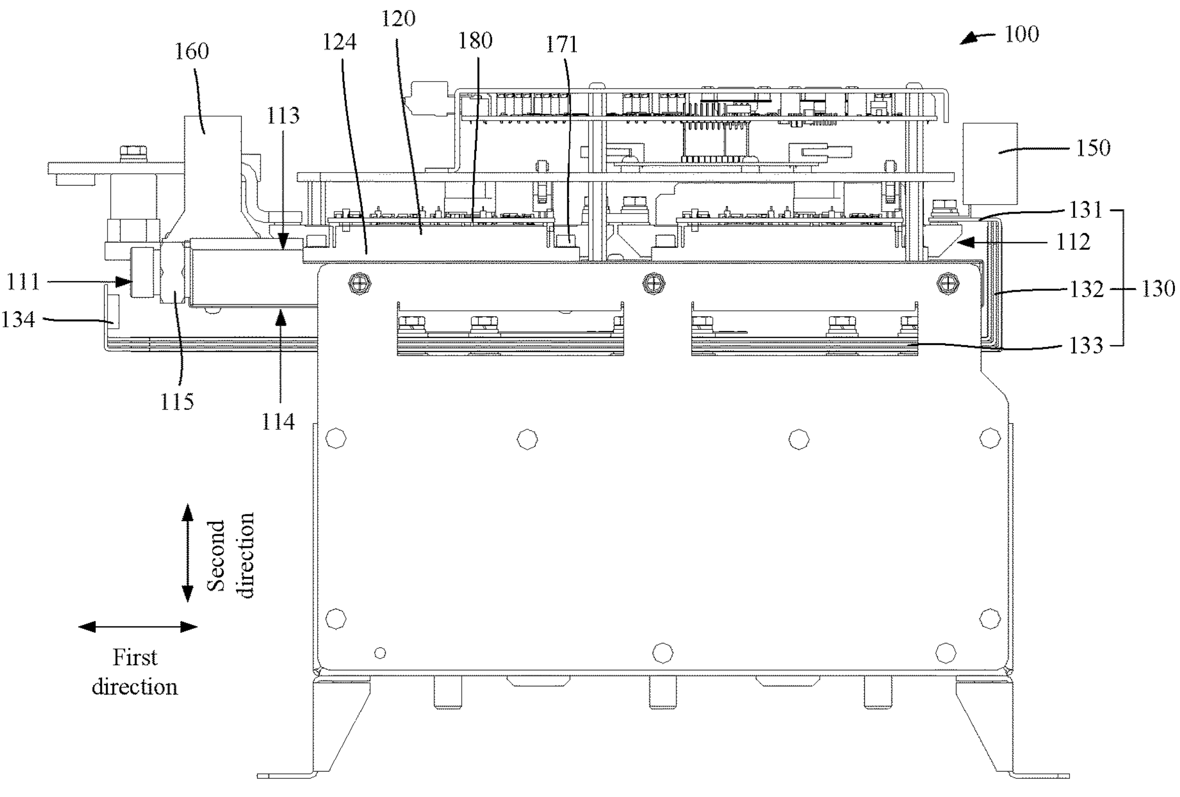
FIG. 4 is a fourth schematic view of a power device according to an embodiment of the present disclosure.

Furthermore, as shown in FIG. 1, FIG. 3 and FIG. 4, the power semiconductor device 120 is provided at the third side 113 of the liquid cooling plate 110. Optionally, the power semiconductor device 120 is arranged at the side of the liquid cooling plate 110 in the thickness direction. The power semiconductor device 120 is provided with a heat dissipation substrate 124 at the side close to the liquid cooling plate 110. The heat dissipation substrate 124 is connected to the liquid cooling plate 110. The heat dissipated from the power semiconductor device 120 is subjected to heat exchange with the liquid cooling plate 110 through the heat dissipation substrate 124 on the bottom. Optionally, the heat dissipation substrate 124 of the power semiconductor device 120 adopts a heat conductive material to contact the liquid cooling plate 110.

Furthermore, as shown in FIG. 1, FIG. 3 and FIG. 4, the driving board 190 is provided at the third side 113 of the liquid cooling plate 110. The driving board 190 is connected to the side of the power semiconductor device 120 away from the heat dissipation substrate 124. Optionally, the driving board 190 is connected to a pin at the top of the power semiconductor device 120.

Figure 5:
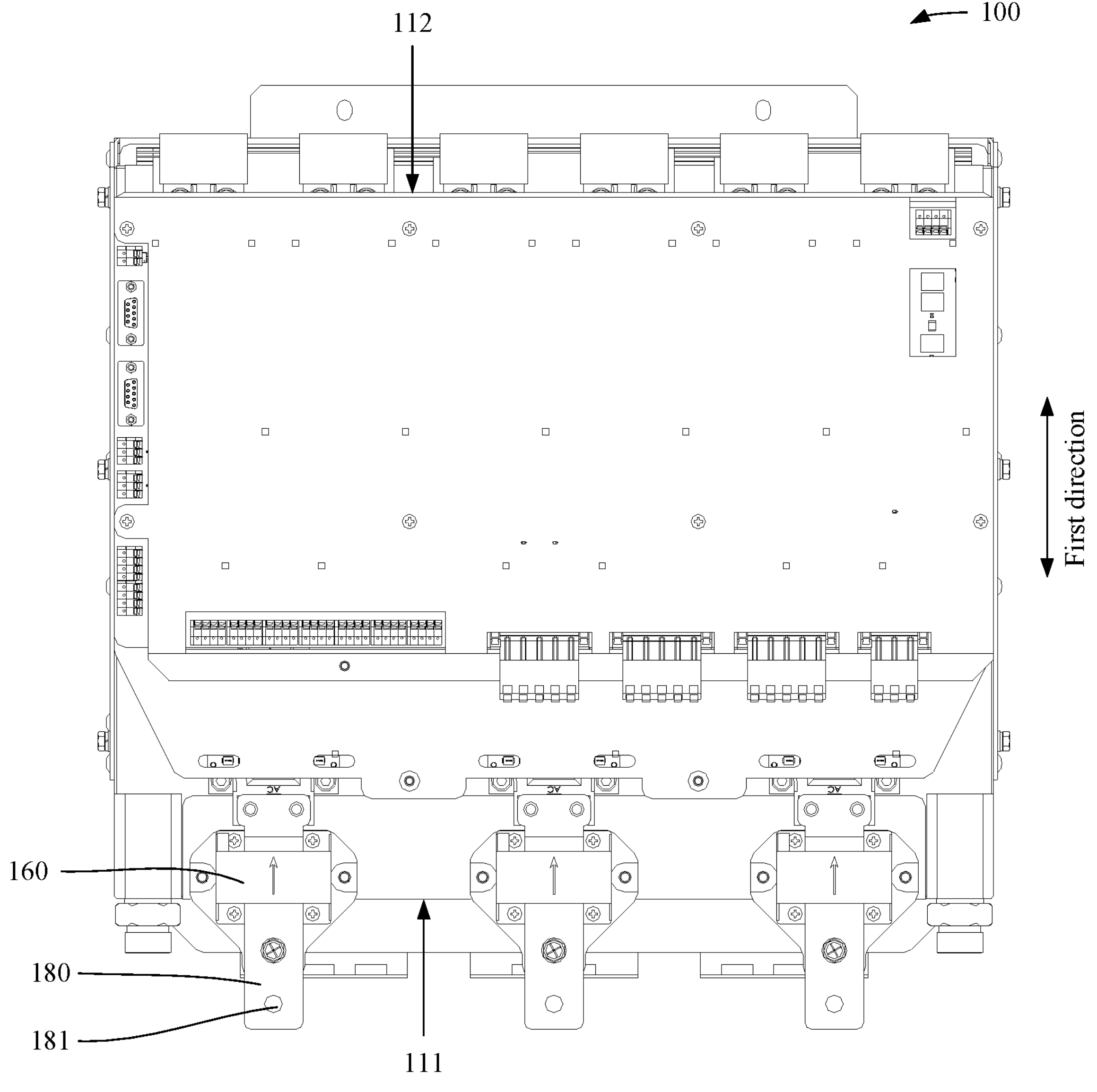
FIG. 5 is a fifth schematic view of a power device according to an embodiment of the present disclosure.
Figure 6:
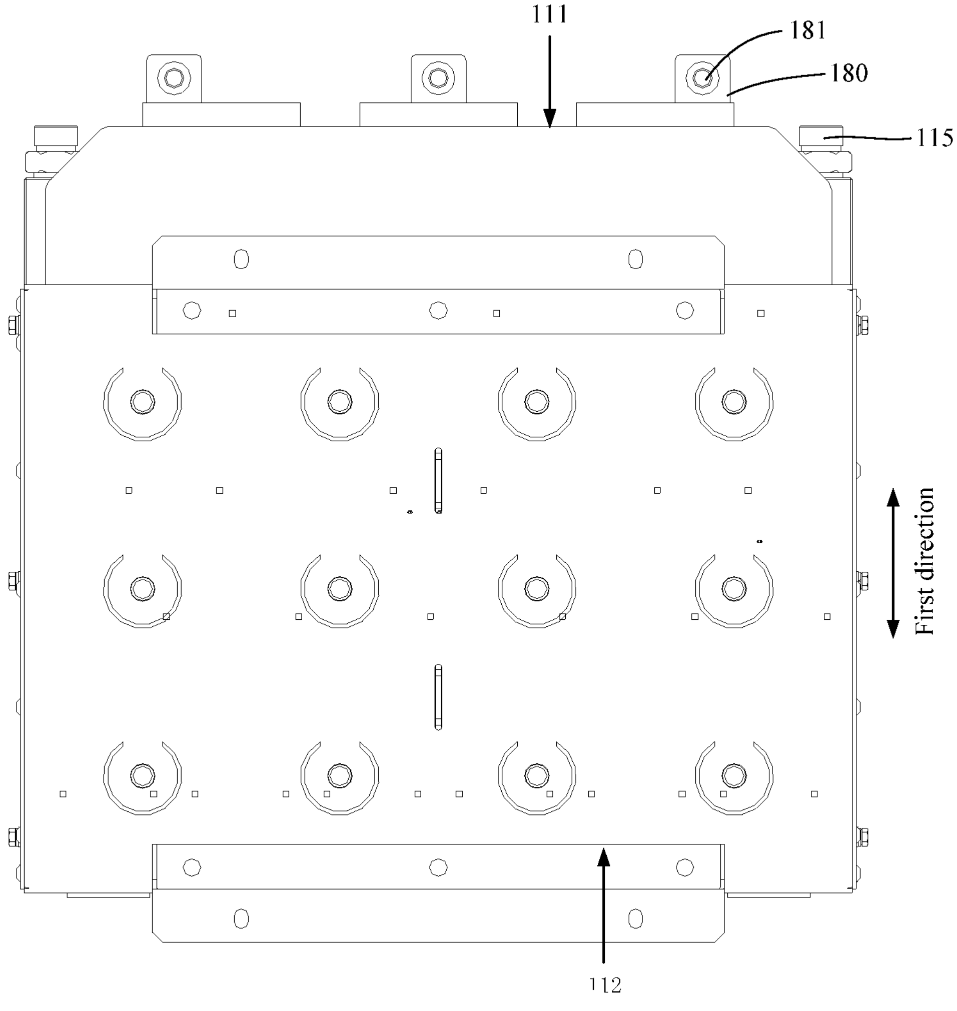
FIG. 6 is a sixth schematic view of a power device according to an embodiment of the present disclosure.

Furthermore, as shown in FIG. 1, FIG. 5 and FIG. 6, one end of the first copper bar 180 is connected to the power semiconductor device 120. The other end of the first copper bar 180 is formed with an AC side interface 181. The AC side interface 181 is provided at the first side 111 of the liquid cooling plate 110.

Furthermore, as shown in FIG. 3 and FIG. 4, the laminated busbar 130 comprises a first section 131, a second section 132 and a third section 133. Specifically, the first section 131 is provided at the third side 113 of the liquid cooling plate 110. One end of the first section 131 is connected to the power semiconductor device 120. The second section 132 is provided at the second side 112 of the liquid cooling plate 110. One end of the second section 132 is connected to the other end of the first section 131, i.e., one end of the second section 132 is connected to the end of the first section 131 away from the power semiconductor device 120. The third section 133 is provided at the fourth side 114 of the liquid cooling plate 110. One end of the third section 133 is connected to the other end of the second section 132, i.e., one end of the third section 133 is connected to the end of the second section 132 away from the first section 131. The other end (the end of the third section 133 away from the second section 132) of the third section 133 is formed with a DC side interface 134. The DC side interface 134 is provided at the first side 111 of the liquid cooling plate 110. The laminated busbar 130 winds the third side 113 of the liquid cooling plate 110, the second side 112 of the liquid cooling plate 110 and the fourth side 114 of the liquid cooling plate 110, the heat produced by the laminated busbar 130 can be subjected to heat exchange with the liquid cooling plate 110 via the natural convection of air, so as to ensure the working performance of the laminated busbar 130. The laminated busbar 130 is also called a compound busbar, a stacked busbar, a stacked busbar row or a composite copper bar, and is a connection row of a multi-layer composite structure.

Furthermore, the capacitor bank 140 is provided at the fourth side 114 of the liquid cooling plate 110. The capacitor bank 140 is connected to the third section 133. The heat produced by the capacitor bank 140 can be subjected to heat exchange with the liquid cooling plate 110 via the natural convection of air, so as to ensure the working performance of the capacitor bank 140. Through disposing the capacitor bank 140, a DC voltage can be stabilized, and the voltage fluctuation at a DC side is reduced. In addition, since both the AC side interface 181 and the DC side interface 134 are provided at the first side 111 of the liquid cooling plate 110, the liquid cooling plate 110 can also be used to cool the AC side interface 181 and the DC side interface 134. Generally, all types of interfaces need to reserve a sufficient space for assembling operations, and thus, in order to reduce the operation space of a cabinet 210, the AC side interface 181 and the DC side interface 134 of the power device 100 and the liquid cooling interface 115 of the liquid cooling plate 110 are all provided at the first side 111 of the liquid cooling plate 110, and this designing method can maximize the use of the space of the cabinet 210.

In the technical solution defined by the present disclosure, through disposing the power semiconductor device 120 at the third side 113 of the liquid cooling plate 110, disposing the capacitor bank 140 at the fourth side 114 of the liquid cooling plate 110, disposing the AC side interface 181 and the DC side interface 134 at the first side 111 of the liquid cooling plate 110, winding the laminated busbar 130 on the third side 113 of the liquid cooling plate 110, the second side 112 of the liquid cooling plate 110 and the fourth side 114 of the liquid cooling plate 110, firstly, the spatial layout of the power device 100 can be optimized, the structures and components become more compact therebetween, which is beneficial for reducing the overall volume of the power device 100 and improving the power density per unit volume; secondly, the heat exchanging ability of the liquid cooling plate 110 can be fully used, it is ensured that each structure or each component in the power device 100 works at a suitable temperature, and this helps prolong the service life.

In an embodiment of the present disclosure, the power device 100 further comprises the heat conductive layer. Specifically, the heat conductive layer is provided between the heat dissipation substrate 124 of the power semiconductor device 120 and the liquid cooling plate 110. Disposing the heat conductive layer can fill tiny gaps between the heat dissipation substrate 124 of the power semiconductor device 120 and the liquid cooling plate 124, and further improve the heat exchanging efficiency. Optionally, the heat conductive layer adopts the materials such as silicone grease, and is used to fill the gaps between the heat dissipation substrate 124 and the liquid cooling plate 110.

Furthermore, as shown in FIG. 3 and FIG. 4, the heat dissipation substrate 124 of the power semiconductor device 120 is connected to the liquid cooling plate 110 via a first connecting member 171. Through disposing the first connecting member 171, a detachable connection between the heat dissipation substrate 124 of the power semiconductor device 120 and the liquid cooling plate 110 can be achieved, and this helps an operator to disassemble and assemble the power semiconductor device 120. Optionally, the first connecting member 171 is a screw.

In an embodiment of the present disclosure, as shown in FIG. 1, FIG. 3 and FIG. 4, the power device 100 further comprises an absorption capacitor 150. Specifically, the absorption capacitor 150 is connected to the first section 131 of the laminated busbar 130. The absorption capacitor 150 is connected to the power semiconductor device 120. The absorption capacitor 150 has the function similar to a low pass filter in circuits, and can absorb a peak voltage.

Furthermore, through disposing the absorption capacitor 150 at the third side 113 of the liquid cooling plate 110, the heat produced by the absorption capacitor 150 can be subjected to heat exchange with the liquid cooling plate 110 via the natural convection of air, so as to ensure the working performance of the absorption capacitor 150. Optionally, the absorption capacitor 150 is provided at a position of the third side 113 of the liquid cooling plate 110 close to the second side 112.

Furthermore, the longest distance between the laminated busbar 130 and the liquid cooling plate 110 in the second direction is a first distance. The longest distance between the absorption capacitor 150 and the liquid cooling plate 110 in the second direction is a second distance. The first distance is not greater than the second distance, i.e., the longest distance between the laminated busbar 130 and the liquid cooling plate 110 in the second direction is not greater than the longest distance between the absorption capacitor 150 and the liquid cooling plate 110 in the second direction, so as to ensure that the rear side (the side in the second direction) of the power device 100 can keep the smallest distance with the cabinet 210, and the structures and components become more compact therebetween, which is beneficial for reducing the overall volume of the power device 100 and improving the power density per unit volume.

In an embodiment of the present disclosure, as shown in FIG. 1, FIG. 2, FIG. 3, FIG. 4 and FIG. 5, the power device 100 further comprises an electric current sensor 160. Specifically, the first copper bar 180 penetrates the electric current sensor 160. The electric current sensor 160 is used for obtaining the value of the electric current of the AC side interface 181.

In an embodiment of the present disclosure, the number of the power semiconductor device 120 is at least one. Through disposing at least one power semiconductor device 120, i.e., there can be one, two or multiple power semiconductor devices 120; considering the size of the occupied space, the cost and other factors, the power semiconductor device 120 can be disposed flexibly according to actual needs. Optionally, when there are two or multiple power semiconductor devices 120, the power semiconductor devices 120 are in parallel connection.

In an embodiment of the present disclosure, the included angle between the second section 132 and the first section 131 is 85° to 95°. Through disposing the included angle between the second section 132 and the first section 131 to be 85° to 95°, the bending and commutating of the laminated busbar 130 can be achieved, and this helps reduce the size of the space occupied by the laminated busbar 130, and is convenient for the connection of different members. Optionally, the included angle between the first section 131 and the second section 132 is 90°, i.e., the first section 131 is perpendicular to the second section 132.

Furthermore, the included angle between the third section 133 and the second section 132 is 85° to 95°. Through disposing the included angle between the third section 133 and the second section 132 to be 85° to 95°, the bending and commutating of the laminated busbar 130 can be achieved, and this helps reduce the size of the space occupied by the laminated busbar 130, and is convenient for the connection of different members. Optionally, the included angle between the second section 132 and the third section 133 is 90°, i.e., the second section 132 is perpendicular to the third section 133.

Figure 7:
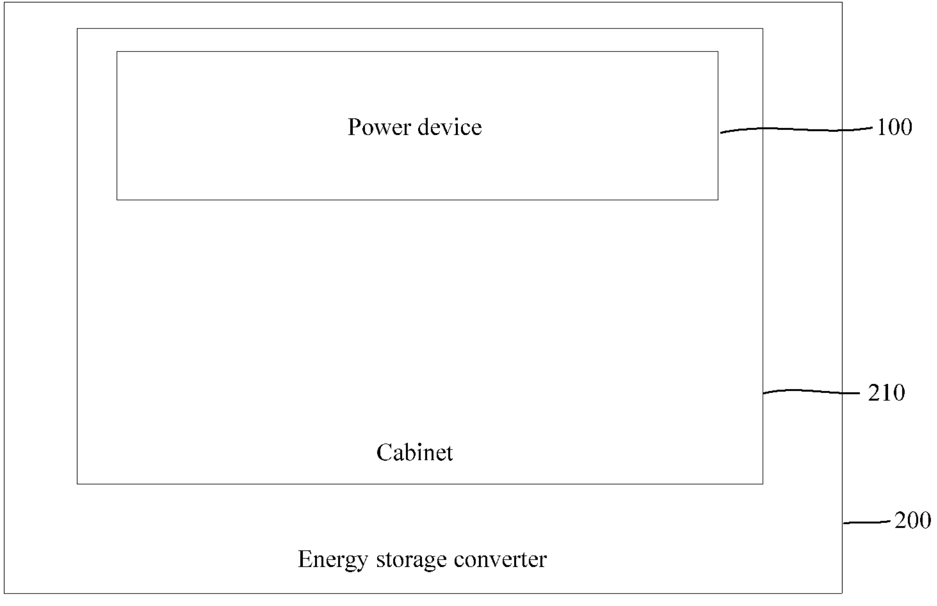
FIG. 7 is a schematic view of an energy storage converter according to an embodiment of the present disclosure.

In the technical solution of the present disclosure, as shown in FIG. 7, the energy storage converter 200 comprises the cabinet 210 and the power device 100 in any of the above embodiments. The power device 100 is disposed in the cabinet 210. The power device 100 is connected to the cabinet 210. Compared with a traditional structure, the energy storage converter 200 defined in the present disclosure has a more compact structure and a smaller volume, and has a higher power density per unit volume.

According to the embodiments of the power device and the energy storage converter of the present disclosure, through disposing the power semiconductor device at the third side of the liquid cooling plate, disposing the capacitor bank at the fourth side of the liquid cooling plate, disposing the AC side interface and the DC side interface at the first side of the liquid cooling plate, winding the laminated busbar on the second side of the liquid cooling plate, the third side of the liquid cooling plate and the fourth side of the liquid cooling plate, firstly, the spatial layout of the power device can be optimized, the structures and components become more compact therebetween, which is beneficial for reducing the overall volume of the power device and improving the power density per unit volume; secondly, the heat exchanging ability of the liquid cooling plate can be fully used, it is ensured that each structure or each component in the power device works at a suitable temperature, and this helps prolong the service life.

In the present disclosure, the terms of "first", "second" and "third" are used only for the purpose of description and shall not be understood to indicate or imply any relative importance, unless otherwise clearly defined; the term of "multiple" indicates two or more, unless otherwise explicitly specified or defined. The terms "mounting", "connecting", "connected to", "fix" and the like should be understood in a broad sense, for example, the term "connected to" can be a fixed connection, a detachable connection, or an integral connection, and can be a direct connection or an indirect connection through an intermediate medium. For a person skilled in the art, they may understand the specific meanings of the above-mentioned terms in the present disclosure according to specific circumstances.

In the specification of the present disclosure, the orientation or position relations indicated by the terms of "upper", "lower", "left", "right", "front", "rear" and the like are based on the orientation or position relations shown in the accompanying drawings, and they are just intended to conveniently describe the present application and simplify the description, and are not intended to indicate or imply that the devices or units as indicated should have specific orientations or should be configured or operated in specific orientations, and then should not be construed as limitations to the present application.

In the description of the present specification, the descriptions of the phrases "one embodiment", "some embodiments" and "specific embodiments" and the like mean that the specific features, structures, materials or characteristics described in combination with the embodiment(s) or example(s) are included in at least one embodiment or example of the present disclosure. In the specification, the schematic representation of the above phrases does not necessarily refer to the same embodiment or example. Moreover, the particular features, structures, materials or characteristics described may be combined in a suitable manner in any one or more of the embodiments or examples.

The descriptions above are only some embodiments of the present disclosure, and are not used to limit the present disclosure. For a person skilled in the art, the present disclosure may have various changes and variations. Any modifications, equivalent substitutions, improvements, etc. made within the spirit and principle of the present disclosure shall all be included in the protection scope of the present disclosure.

What is claimed is:

1. A power device comprising:

a liquid cooling plate, wherein the liquid cooling plate is provided with a first side and a second side arranged opposite to each other along a first direction, the liquid cooling plate is provided with a third side and a fourth side arranged opposite to each other along a second direction, the second direction is perpendicular to the first direction, the liquid cooling plate comprises a liquid cooling interface, and the liquid cooling interface is provided at the first side of the liquid cooling plate;

a power semiconductor device, arranged at the third side of the liquid cooling plate, wherein the power semiconductor device has a heat dissipation substrate at one side of the power semiconductor device close to the liquid cooling plate, and the heat dissipation substrate is connected to the liquid cooling plate;

a driving board, arranged at the third side of the liquid cooling plate and connected to one side of the power semiconductor device away from the heat dissipation substrate;

a first copper bar, wherein one end of the first copper bar is connected to the power semiconductor device, and an AC side interface is formed at the other end of the first copper bar and is arranged at the first side of the liquid cooling plate;

a laminated busbar comprising:

a first section, arranged at the third side of the liquid cooling plate, wherein one end of the first section is connected to the power semiconductor device;

a second section, arranged at the second side of the liquid cooling plate, wherein one end of the second section is connected to the other end of the first section;

a third section, arranged at the fourth side of the liquid cooling plate, wherein one end of the third section is connected to the other end of the second section, the other end of the third section is provided with a DC side interface, wherein the DC side interface is arranged at the first side of the liquid cooling plate; and a capacitor bank, arranged at the fourth side of the liquid cooling plate, wherein the capacitor bank is connected to the third section.

2. The power device according to claim 1, further comprising:

a heat conductive layer, provided between the heat dissipation substrate of the power semiconductor device and the liquid cooling plate.

3. The power device according to claim 1, further comprising:

an electric current sensor, wherein the first copper bar penetrates the electric current sensor.

4. The power device according to claim 1, further comprising:

an absorption capacitor connected to the first section, wherein the absorption capacitor is connected to the power semiconductor device.

5. The power device according to claim 2, further comprising:

an absorption capacitor connected to the first section, wherein the absorption capacitor is connected to the power semiconductor device.

6. The power device according to claim 3, further comprising:

an absorption capacitor connected to the first section, wherein the absorption capacitor is connected to the power semiconductor device.

7. The power device according to claim 4, wherein the absorption capacitor is provided at the third side of the liquid cooling plate, the longest distance between the laminated busbar and the liquid cooling plate in the second direction is a first distance, the longest distance between the absorption capacitor and the liquid cooling plate in the second direction is a second distance, and the first distance is not greater than the second distance.

8. The power device according to claim 1, wherein the power semiconductor device is connected to the liquid cooling plate via a first connecting member.

9. The power device according to claim 2, wherein the power semiconductor device is connected to the liquid cooling plate via a first connecting member.

10. The power device according to claim 3, wherein the power semiconductor device is connected to the liquid cooling plate via a first connecting member.

11. The power device according to claim 1, wherein a number of the power semiconductor device is at least one.

12. The power device according to claim 1, wherein an included angle between the second section and the first section is 85° to 95°.

13. The power device according to claim 1, wherein an included angle between the third section and the second section is 85° to 95°.

14. An energy storage converter comprising:

a cabinet; and a power device provided in the cabinet, wherein the power device is connected to the cabinet;

the power device comprising:

a liquid cooling plate, wherein the liquid cooling plate is provided with a first side and a second side arranged opposite to each other along a first direction, the liquid cooling plate is provided with a third side and a fourth side arranged opposite to each other along a second direction, the second direction is perpendicular to the first direction, the liquid cooling plate comprises a liquid cooling interface, and the liquid cooling interface is provided at the first side of the liquid cooling plate;

a power semiconductor device, arranged at the third side of the liquid cooling plate, wherein the power semiconductor device has a heat dissipation substrate at one side of the power semiconductor device close to the liquid cooling plate, and the heat dissipation substrate is connected to the liquid cooling plate;

a driving board, arranged at the third side of the liquid cooling plate and connected to one side of the power semiconductor device away from the heat dissipation substrate;

a first copper bar, wherein one end of the first copper bar is connected to the power semiconductor device, and an AC side interface is formed at the other end of the first copper bar and is arranged at the first side of the liquid cooling plate;

a laminated busbar comprising:

a first section arranged at the third side of the liquid cooling plate, wherein one end of the first section is connected to the power semiconductor device;

a second section arranged at the second side of the liquid cooling plate, wherein one end of the second section is connected to the other end of the first section;

a third section arranged at the fourth side of the liquid cooling plate, wherein one end of the third section is connected to the other end of the second section, the other end of the third section is provided with a DC side interface, and the DC side interface is arranged at the first side of the liquid cooling plate; and a capacitor bank arranged at the fourth side of the liquid cooling plate, wherein the capacitor bank is connected to the third section.

15. The energy storage converter according to claim 14, wherein the power device further comprising:

a heat conductive layer provided between the heat dissipation substrate of the power semiconductor device and the liquid cooling plate.

16. The energy storage converter according to claim 14, wherein the power device further comprising:

an electric current sensor, wherein the first copper bar penetrates the electric current sensor.

17. The energy storage converter according to claim 14, wherein the power device further comprising:

an absorption capacitor connected to the first section, wherein the absorption capacitor is connected to the power semiconductor device.

18. The energy storage converter according to claim 17, wherein the absorption capacitor is provided at the third side of the liquid cooling plate, the longest distance between the laminated busbar and the liquid cooling plate in the second direction is a first distance, the longest distance between the absorption capacitor and the liquid cooling plate in the second direction is a second distance, and the first distance is not greater than the second distance.

19. The energy storage converter according to claim 14, wherein the power semiconductor device is connected to the liquid cooling plate via a first connecting member.

20. The energy storage converter according to claim 14, wherein an included angle between the second section and the first section is 85° to 95°.

* * * * *